US007038357B2

(12) United States Patent
Goldenberg et al.

(10) Patent No.: US 7,038,357 B2
(45) Date of Patent: May 2, 2006

(54) STRETCHED ROLLED ELECTROACTIVE POLYMER TRANSDUCERS AND METHOD OF PRODUCING SAME

(75) Inventors: Andrew A. Goldenberg, Toronto (CA); Landy Toth, Toronto (CA); Alex Kapps, Thornhill (CA)

(73) Assignee: Engineering Services Inc., Toronto (CA)

( * ) Notice: Subject to any disclaimer, the term of this patent is extended or adjusted under 35 U.S.C. 154(b) by 0 days.

(21) Appl. No.: 10/644,894

(22) Filed: Aug. 21, 2003
(Under 37 CFR 1.47)

(65) Prior Publication Data
US 2005/0040733 A1    Feb. 24, 2005

(51) Int. Cl.
*H01L 41/08* (2006.01)
(52) U.S. Cl. .................. 310/328; 310/330; 310/800
(58) Field of Classification Search ............ 310/328, 310/330–332, 363, 364, 800
See application file for complete search history.

(56) References Cited

U.S. PATENT DOCUMENTS

| 6,343,129 | B1  |   | 1/2002  | Pelrine et al. |          |
|-----------|-----|---|---------|----------------|----------|
| 6,376,968 | B1  | * | 4/2002  | Taylor et al.  | 310/339  |
| 6,376,971 | B1  |   | 4/2002  | Pelrine et al. |          |
| 6,543,110 | B1  | * | 4/2003  | Pelrine et al. | 29/25.35 |
| 6,545,384 | B1  | * | 4/2003  | Pelrine et al. | 310/309  |
| 6,806,621 | B1  | * | 10/2004 | Heim et al.    | 310/328  |
| 6,847,155 | B1  | * | 1/2005  | Schwartz et al.| 310/328  |
| 6,867,533 | B1  | * | 3/2005  | Su et al.      | 310/328  |

OTHER PUBLICATIONS

"High Speed Electrically Actuated Elastomers with strain Greater Than 100%;" Pelrine et al; Feb. 4, 2000; vol. 287; Science; pp. 836-839.

* cited by examiner

*Primary Examiner*—Mark Budd
(74) *Attorney, Agent, or Firm*—Nancy E. Hill; Will & Schumacher

(57) ABSTRACT

A transducer is designed and fabricated using stretched rolled electroactive polymers. The invention includes the design, fabrication, and integration of a stretched rolled actuator system with corresponding sensing, control and power subsystems. The invention presented is based on the improved performance of electroactive polymer transducers that can be achieve by prestretching the polymeric material. In this invention, the preferred stretch is maintained in a rolled configuration by introducing structural elements to the transducer. The structural elements facilitate fabrication of the transducer as well as provide a compact and efficient means of maintaining stretch and the desired boundary conditions on the electroactive polymer during operation. These conditions together are used to improve and tailor the strain response of the transducer.

33 Claims, 10 Drawing Sheets

US 7,038,357 B2

STRETCHED ROLLED ELECTROACTIVE POLYMER TRANSDUCERS AND METHOD OF PRODUCING SAME

FIELD OF THE INVENTION

The present invention relates to transducers and in particular electroactive polymer transducers.

BACKGROUND OF THE INVENTION

The present invention relates to the electrostriction and electrostatic charge induced striction of electroactive polymers and the application of this phenomenon to transducers. Electroactive polymer based transducers are activated by application of an electrical field. The response of the material (embodied by strain) depends on this applied field and on the boundary conditions imposed by the environment. The dependency of strain on the applied field is due to the combined phenomena of electrostriction and/or the Maxwell stress effect. In the case of electrostatic charge induced striation, strong dependence of the strain response to the boundary conditions arises since the actuating medium behaves as an elastic body under load to which the Maxwell stress effect is one of several boundary conditions. Electrostriction is a coupling effect between the strain and the square of the applied electric field. It is observed in ferroelectric polymers due to crystalline phase transitions induced by the applied electric field.

The response in any particular direction can be tailored using anisotropic boundary conditions or by stretching the polymer to impose anisotropic mechanical properties about the operating point. In the case that the electroactive polymer is used above the glass transition temperature, the stretched condition must be rigorously maintained during operation. In this case, the boundary conditions can be fixed by careful application of frames and supporting elements. In any comprehensive model of the actuator, these elements must be considered. The boundary conditions often impair the strain of the actuator in more than the intended direction. This effect is often evident when soft frames are used on the film to prevent crack propagation, but also oppose the material in the direction of actuation. Many of the structural reinforcements that are used to prevent device failure or maintain a stretched configuration have structural rigidity that cannot be entirely controlled in every direction. The rigidity of these elements may have an adverse effect on the performance of the transducer and in some instances may cause device failure. Beyond the boundary, near the intersections of free and fixed boundary conditions there exists a boundary phenomenon over which the local response of the electroactive polymer can vary dramatically in comparison to the majority of the material. Many of these conditions lead to local failure of the dielectric electroactive polymer transducer (DET) during operation and should be considered during the design and fabrication of the actuator.

The act of stretching the electroactive polymer can significantly improve its strain response [R. Pelrine, R. Kombluh, Q. Pei, and J. Joseph, Science, 287, 836, 2000]. In the case of electrostatic charge induced striction, anisotropic stretching of the electroactive polymer can improve and/or tailor actuator performance in three different ways: create anisotropic constitutive mechanical properties, modify the boundary conditions, and improve the dielectric strength of the material.

The creation of anisotropic constitutive mechanical properties can be used to modify the output of the actuator in a similar way to imparting anisotropic boundary conditions on it. Actuators comprised of materials that experience extreme strain hardening (such as silicones) can benefit greatly from anisotropic prestretching. It has been demonstrated in the literature that high transverse prestretching of such materials can be used to optimize their axial strain response.

The dielectric strength of the material can also be improved with prestretch. This in turn means that higher fields can be applied to the film before dielectric breakdown occurs. This effect has been reported in the literature for polyacrylate materials [G. Kofod, R. Kombluh, R. Pelrine, and P. Sommer-Larsen, SPIE Proceedings 4329, 141, 2001]. One existing hypothesis states that the increase in the dielectric strength can be attributed to the extension of polymer chains during prestretching in a direction perpendicular to the applied field. This decreases the energy that free electrons can transfer to the chains as they pass from one electrode to the other and therefore increases the energy that these electrons can possess before they lead to avalanche breakdown. The dielectric strength may also increase due to thinning of the polymer film with stretch in the case that the electroactive polymer experienced thermal dielectric breakdown.

The existing mechanisms used to maintain prestretch in the electroactive polymer during operation are bulky and as such add significant weight and size to practical devices [R. Pelrine et al., U.S. Pat. No. 6,376,971 issued Apr. 23, 2002; R. Peirine et al., U.S. Pat. No. 6,343,129 issued Jan. 29, 2002]. Furthermore, the current state of the art for practically realizable mechanisms for maintaining prestretch interfere with the strain response of the electroactive polymer and as such have limited the response of practical devices to strain levels much below those demonstrated in laboratory settings.

Accordingly it would be advantageous to provide a dielectric elastomer transducer in a lightweight, compact package. Further it would be advantageous to provide a dielectric elastomer transducer having high transverse prestretch polymeric material. It would be advantageous to utilize stiff support material to such that the polymer stretched in the circumferential direction while also provide a means of interfacing the device with its environment and minimizing interference with the axial movement of the transducer. Furthermore, it would be advantageous to optimize mechanical properties of the support materials to further enhance performance of the transducer by increasing the maximum strain output of the device, increasing the stiffness of the device or Introducing biaxial stretch to the electroactive polymer layers.

SUMMARY OF THE INVENTION

The present invention relates to a class of electroactive polymer based transducers constructed from the combined stretching and rolling of electroactive polymer and electrode layers. Each transducer contains at least two patterned electrodes, at least one stretched electroactive polymer, a means of electrically connecting the transducer to external circuitry, and a means of mechanically connecting the transducer to the desired mechanical load. The resulting transducers are appropriate for applications requiring actuators and/or sensors that must sustain large deformations and achieve high energy density during operation. In one exemplar application, the resulting transducer applies pressure to the appendage of a human subject in a confined space.

In one embodiment, the stretched electroactive polymer and patterned electrode layers are rolled about a central mandrel. The mandrel may consist of one or more removable parts, each of which may assist with the fabrication of the electroactive polymer transducer. Furthermore, the mandrel or components thereof may remain as an integral component of the resulting transducer after fabrication. In this case, the mandrel provides structural support for the layers throughout the lifetime of the device and maintains stretch in the layers as necessary for enhanced performance of the transducer.

In another embodiment, thin reinforcing elements are attached to the stretched electroactive polymer and patterned electrode layers prior to the rolling process. After rolling, the reinforcing elements become an integral part of the superstructure of the transducer. These elements facilitate homogeneous deformation of separate layers, maintain prestretch of the electroactive polymer layers, and prevent sliding between layers during operation of the completed transducer thereby enhancing the performance of the transducer.

In yet another embodiment, the effect of prestretch or portion thereof is permanently imparted to the electroactive polymer during polymerization of the polymer films. These effects can be achieved by polymerizing the polymer in the presence of properly oriented electrical fields, magnetic fields and/or stress fields prior to and during the cross-linking stage of the polymerization process. After permanent modification of the properties of the electroactive polymer in this manner, the electroactive polymer film is patterned with electrodes and rolled into a final transducer. By this technique, the resulting transducer is further lightened by the reduction or even elimination of the reinforcing elements required to maintain orientation, thereby improving the energy density available from the resulting transducer.

In another embodiment, the electrodes of the transducer are patterned such that portions of the electrodes are used for actuation of the transducer and limited portions of the electrodes are used to obtain sensory feedback from the transducer. In one example, the electrodes near to the central rolls of the transducer are patterned to receive sensory feedback from the transducer while the outer layers are configured for actuation. This form of electrode patterning improves the multifunctionality of the resulting transducer while maintaining a compact configuration.

In yet another embodiment, the mandrel used to support the stretched rolled electroactive polymer layers is hollow. The hollow recess of the mandrel is used to house sensory electronics or sensory components necessary for receiving feedback from the resulting transducer. Thereby, the size of the overall transducer and electronics is reduced and the energy density available from the resulting device is increased. Furthermore, the power electronics or voltage amplifier used to drive the transducer can be situated within the cavity of the mandrel. This integration of the electronics with the electroactive polymer transducer provides a means of isolating any high voltage signals required to actuate the transducer from the surrounding environment. Thereby the integration of the high voltage electronics into the mandrel of the transducer improves the safety and reduces the size of the resulting device.

In a further embodiment, the reinforcement elements used to maintain the stretch in the electroactive polymer are multifunctional elements. In one example, the reinforcement elements are constructed from stiff, thin dielectric media suitable for energy storage. In addition to providing reinforcement to the electroactive polymer layers, these elements provide a means of local energy storage for transient actuation of the transducer and/or facilitate storage of the energy derived from the use of the transducer as a generator.

In yet another example, the electronics used to drive the transducer are Integrated directly into the reinforcement elements.

BRIEF DESCRIPTION OF FIGURES

A more complete understanding of the invention and many of the achieved advantages thereof will be readily appreciated by reference to the following detailed description when considered in connection with the accompanying figures herein:

FIG. 1b: is an isometric Cut-view of the active region of the stretched rolled electroactive polymer transducer of FIG. 1a;

BRIEF DESCRIPTION OF THE DRAWINGS

General Overview

Figure 1A:
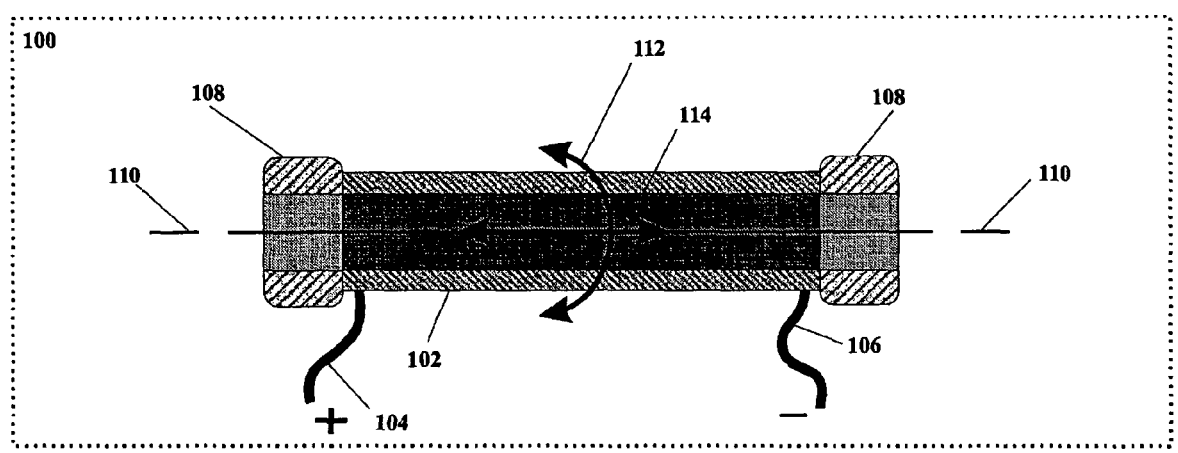
FIG. 1a: is a schematic diagram of a general stretched rolled electroactive polymer transducer constructed in accordance with the invention.

Referring to FIG. 1a a stretched rolled electroactive polymer transducer of the present invention is shown generally at 100. The transducer is comprised of several components that work together to improve the performance of the transducer. The active region 102 of the device is comprised of alternating layers of conducting and stretched dielectric materials that are ultimately responsible for actuation of the device (described in more detail below). The dielectric layers of the active region 102 are stretched in both the circumferential direction 112 and the axial direction 114 during the fabrication process to improve the transduction of the resulting device. The active region 102 is connected to an external power supply by the positive electrical connector 104 and the negative electrical connector 106. The mechanical connectors 108 support the active region 102, the positive electrical connectors 104, and the negative electrical connectors 106. The mechanical connectors 108 are positioned at either end of the active region 102. The mechanical connectors 108 also provide an interface for connecting the device to the surrounding environment. Furthermore, the mechanical connectors 108 provide a means of maintaining uniform deformation throughout the active region 102 during operation.

When a voltage is applied between the positive electrical connector 104 and the negative electrical connector 106, an electric field is established within the active region 102 of the stretched rolled electroactive polymer transducer 100. The electric field imparts triaxial stress to the dielectric portion of the active region 102. This applied triaxial stress constricts the layers of the active region through the thickness of the layers and stretches the layers in the circumferential direction 112 and the axial direction 114. The active region 102 responds to this action by increasing in dimension primarily in the axial direction 114. By this action, the length of the device changes and it can be used as an actuator. In conjunction with the device being used as an actuator, the electrical properties of capacitance and resistance of the active region 102 can be monitored at the positive electrical connector 104 and negative electrical connector 106 to provide strain feedback from the device. By this action, the active region 102 or portions of the active region 102 may also be used as a strain sensor thereby making the device a complete transducer rather than just an actuator. Furthermore, under the combined influence of an axial mechanical input applied along the axial direction 114 and a voltage applied between the positive electrical connector 104 and negative electrical connector 106 of the device, electrical energy may be harvested from the transducer and as such it may be used as an electric generator.

Active Region

Figure 1B:
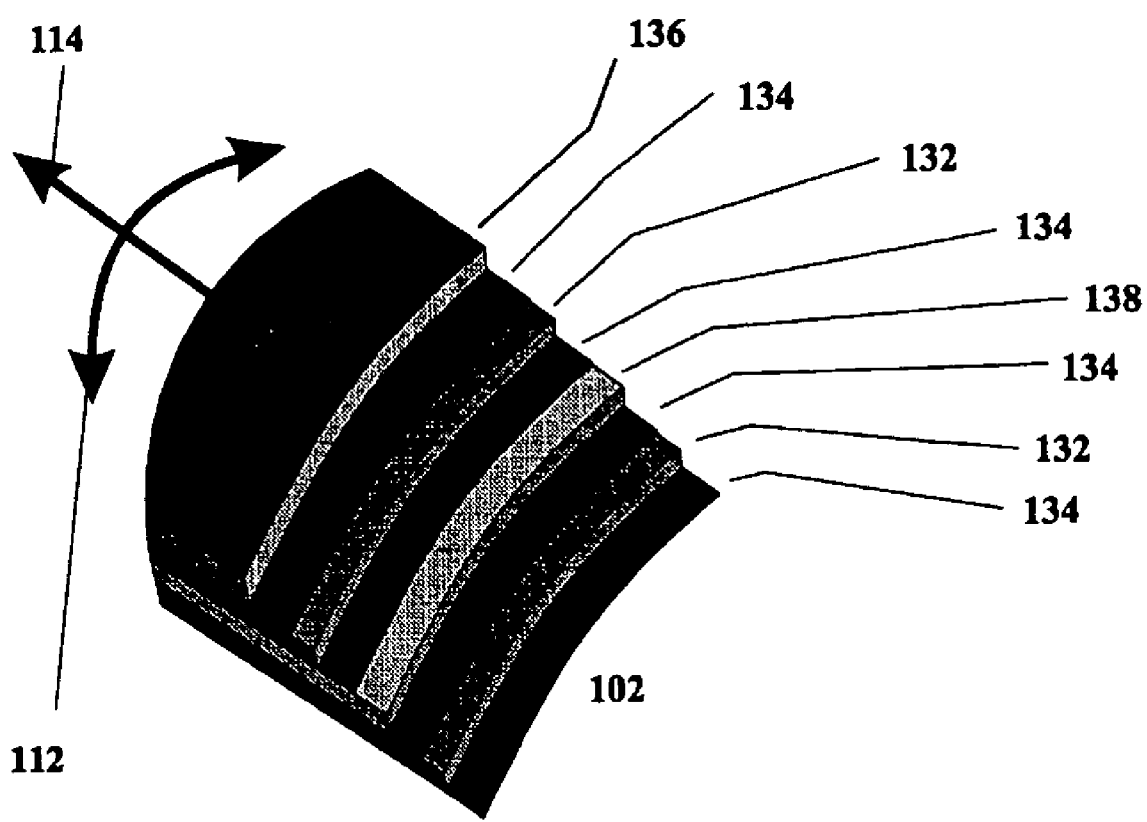

FIG. 1b is an isometric cut-view of an exemplar active region 102, the site for reversible electrical-mechanical transduction within the stretched rolled electroactive polymer transducer 100. The active region 102 is comprised of two or more conducting layers 134 positioned on either side of one or more electroactive polymer layers 132. The active region 102 may also comprise one or more insulating/shielding layers 136. The insulating/shielding layer 136 may be positioned on the outside of the active region 102 or on the inner most layer of the active region 102 to isolate the high voltage signals commonly applied to the active region 102 from the inner layers of the device and/or from the surrounding environment. The active region 102 may also comprise one or more general-purpose layers 138. A general-purpose layer 138 may be included to control the mechanical properties of the active region 102, to facilitate sensory feedback from the transducer, or to reinforce other layers of the active region 102.

An electroactive polymer layer 132 is comprised of a film of a single polymer, copolymer, or composite capable of converting electrical energy to mechanical energy and vice versa. Each electroactive polymer layer 132 commonly ranges in thickness from 0.1 um–1 mm with the optimal thickness depending highly on the particular electroactive polymer and the processing capability of the particular fabrication process. In one example, an electroactive polymer layer 132 consists of a layer of polymer such as VHB 4910 as produced by 3M Corporation. The polymeric material of the electroactive polymer layer 132 is further prestretched or tailored to produce anisotropic mechanical properties, improve the electrical breakdown properties of the layer, and/or thin the layer to enhance the transduction capability of the electroactive polymer. The prestretching may be performed using a number of techniques known to those skilled in the art: The degree of prestretch required to optimize the transduction from the film is highly dependent on the properties of the electroactive polymer. In one case, the optimal prestretch for a given electroactive polymer layer may exceed 500% in the circumferential direction 112 and 100% in the axial direction 114. The mechanism for holding this prestretch in a rolled configuration is provided in one case by the general-purpose layers 138. The general purpose layers may be used to help manage anisotropic structural rigidity, as insulators to separate actuating and sensing portions of the device as discussed more fully below. During fabrication, the polymer can be stretched and then a general purpose layer 138 with strong anisotropy is bonded to the polymer. This combination helps to maintain the prestretch in the desired directions. For example, if the general purpose layer is a thin fiber composite with fiber orientation around the circumference of the device, then by bonding the stretched electroactive polymer layer to the general purpose layer, the movement can be constrained in the circumferential direction while allowing compliance in the axial direction.

Each electroactive polymer layer 132 is surrounded on either side by a patterned conductive layer 134. The conductive layer 134 facilitates uniform charge delivery over the surface of the electroactive polymer layer 132 necessary to elicit a response from the device. The optimal properties of a conductive layer are that it is mechanically invisible in the desired directions of transduction and conducts sufficiently well to facilitate charge flow at the bandwidth limits of the transducer. In the general case, the conductive layer 134 may comprise a conductive gel, powder, grease, polymer, composite or patterned metal. In one particular example, the conductive layer 134 is composed of a layer having a thickness between 0.1 and 100 um, of carbon particulate or flake ranging in characteristic dimension from 0.05–50 um. In another example, the conductive layer 134 is comprised of a thin conducting polymer such as polyaniline. In this configuration, the thickness of the conducting polymer layer is preferably between 0.05–1 um. It is also preferred for the conducting polymer layer to be patterned onto the electroactive polymer layer 132 so as to minimize the mechanical interference of the conducting polymer on the response of the transducer in the axial direction 114.

In one embodiment, the conducting layers 134 are comprised of a plurality of adjacent thin layers. The first layer is deposited directly onto the electroactive polymer layer 132 and typically consists of a thin layer of conducting particulate or flake. The second layer is deposited on top of this conducting particulate layer and typically consists of a low hardness RTV silicone or similar elastomer. In particular, it is desirable for the second layer to exhibit strong adhesive properties to other conducting layers 134 or the electroactive polymer layers 132. In this way, the conducting particulate layer provides the high conductivity required for the conducting layer 134, and the second layer facilitates bonding of adjacent conducting layers and softens the surface of the completed conducting layer 132 to prevent stress concentrations from occurring during operation of the completed transducer.

It is also possible to improve the functionality of the conducting layers 134 by properly structuring the layers to act as a reinforcing layer in the directions transverse to the desired direction of motion as well as act as an electrode. In this case, the conducting medium, such as a thin metallic film, is patterned such that the film has anisotropic mechanical properties. Specifically, the conductive layer 134 may be patterned such that the mechanical stiffness in the axial direction 114 is minimal while the stiffness in the circumferential direction 112 is maximized. Such structuring may also be possible by depositing composite conducting layers 134. In this case, high strength conducting fibers such as silver, or polyaniline fibers are oriented in the circumferential direction 112 and deposited onto the electroactive polymer layer 132 after it has been sufficiently prestretched. Conduction between adjacent fibers is provided by a conducting polymer, powder, or grease. By utilizing this configuration, the conducting layers 134 can maintain a high conductance while providing both structural support in the circumferential direction 112 and allowing for free motion of the active region in the axial direction 114.

In another embodiment, the conducting layers 134 are comprised in part by a thin highly crosslinked elastomeric layer. This highly crosslinked layer overcomes any creep related problems associated with the underlying electroactive polymer layers 132, and thereby improves the operating characteristics and increases the lifetime of the transducer. In this embodiment, this highly crosslinked layer is sufficiently thin such that it does not impede motion during high frequency operation but rather protects the transducer from failure during prolonged periods of constant applied stress in the axial direction 114.

The conducting layers 134 are only patterned onto both sides of the electroactive polymer layers 132 in the regions where activation is desired. The regions near the mechanical connectors 108 and electrical connectors 104, 106 only require a single electrode to prevent charges from flowing through the surrounding materials from one adjacent conducting layer to the next. The conductive layers 132 can also be patterned in multiple configurations to provide multiple electroded regions for both sensory and actuation functionality from the resulting transducer. In one embodiment, the conductive layers 132 are deposited such that the innermost layers of the roll are separate from the outer most layers. The conductive layers 132 may be separated by general purpose layers 138. In this case, the inner most layers are reserved for sensory feedback from the transducer while the outer layers are reserved for actuation. It is preferred to use the inner layers of the transducer for sensory feedback rather than the outer layers since the capacitance change of the inner layers due to axial strain can be closely approximated by a linear relationship. The capacitance to axial strain relationship for the outermost layers is better approximated by a squared relationship. Therefore the sensory feedback circuitry can be simplified if the inner layers are used for sensory feedback rather than the outer layers.

The electroactive polymer layers 132 must adhere to the conducting layers 134 to prevent sliding of adjacent layers during operation. Accordingly conductive grease based electrodes typically are not effective in transducers where the electroactive polymer layers 132 have been sufficiently prestretched prior to the fabrication of the device. Generally prestretching is in the range of 50 to 600% in the circumferential direction and 0 to 150% in the axial direction. In transducers where the conducting layers 134 are comprised of conducting particulate or flake, a layer of adhesive may be necessary to facilitate adhesion between the conducting layers 134 and the adjacent electroactive polymer layers 132. The adhesive may also be patterned over the surface of the electroactive polymer layers 132 and conductive layers 134 prior the rolling stage of the fabrication process. In this way, the adhesive evens out the thickness of the conducting layer 132 in the regions that are not patterned with a conductive material. This consideration helps to keep the roll uniform during the rolling stage in the fabrication of a stretched rolled electroactive polymer transducer.

One or more insulating/shielding layers 136 may be added to the active region 102 to isolate the high voltage conductive layers 134 from the surroundings. The active region 102 may require isolation and shielding from the surrounding environment when that environment contains individuals or equipment that may be sensitive to the potentially high voltage signals present on the conductive layers 134 during operation of the transducer. An insulating/shielding layer 136 may be comprised of an insulating low durometer elastomer. It is important to have insulting/shielding layers 136 where the isolation of the transducer from the environment is crucial to the success of a particular application. In one example, the insulating/shielding layer 136 is comprised of a layer of polydimethylsiloxane microcellular foam ranging in thickness from 0.1 to 1 mm. Although, the insulating/shielding layer 136 prevents direct contact between the conducting layers 134 and the surroundings, it should not significantly impede the motion of the transducer in the axial direction 114.

In another example, the insulating/shielding layer 136 must shield surrounding electronics from the high electric fields produced within the transducer during operation. This is best accomplished when the insulating/shielding layer 136 is a conductive layer as provided by a thin layer, dimensions ranging from 10–100 um, of conducting RTV silicone.

In addition to the insulating/shielding layers 136, it is preferable in some embodiments to add one or more general-purpose layers 138 to the active region 102. A general-purpose layer 138 may be used to control the mechanical properties of the active region 102, to facilitate sensory feedback from the transducer, or to reinforce other layers of the active region 102. In the case that the general-purpose layer 138 is used to modify the mechanical properties of the active region, it may b comprised of an anisotropic composite material. The directional stiffness of this layer may be tailored to meet the specific mechanical requirements of any given application. In one embodiment, a general-purpose layer 138 is comprised of a series of oriented insulating fibers in the circumferential direction 112 of the active region 102 suspended in a soft elastomeric matrix.

In another embodiment, the general-purpose layer 138 is used to obtain sensory feedback from the active region 102. In this case, the layer may be comprised of a polymer with exceptional electrical properties that are to be monitored during operation of the transducer. The changes in the electrical properties of this layer may be used to infer state feedback from the transducer during operation.

In yet another embodiment, the general-purpose layers 138 are added to provide structural reinforcement to the electroactive polymer layers 132 of the active region 102. Operating as a structural reinforcing element, the general-purpose layer 138 is comprised of a thin, stiff ceramic or polymer material such as mica or polypropylene. The stiff polymer is patterned strategically over the electroactive polymer layers 132 to provide structural reinforcement in the circumferential direction 112 while providing freedom of motion in the axial direction 114. The specific patterns used in the deposition of the general-purpose layers 138 are specific to a given application.

In other embodiments, the general-purpose layers 138 used to maintain the stretch in the electroactive polymer are multifunctional elements. In one example, the reinforcement elements, general-purpose layers 138, are constructed from stiff, thin dielectric media suitable for energy storage. In addition to providing reinforcement to the electroactive polymer layers, these elements provide a means of local energy storage for transient actuation of the transducer and/or facilitate storage of the energy derived from the use of the transducer as a generator. In yet another example, the electronics used to drive the transducer are integrated directly into the reinforcement elements. In this example, the general-purpose layers 138 are fabricated using flexible printed circuit boards populated with related circuitry. The electronic traces are directly integrated into the reinforcing elements leading to a direct improvement in the compactness of the transducer.

Generally the eleastomeric material has mechanical properties such as modulus that ranges from 10 KPa to 100 MPa and hardness properties ranging from 10 to 60.

Electrical Connectors

The conducting layers 134 of the active region 102 are connected to the positive electrical connector 104 and the negative electrical connector 106, which in turn are connected to a power supply or sensory feedback circuit (not shown). The electrical connectors provide an interface between the transducer and the electronics. The electrical connectors are layered onto the edges of the active region 102. They are situated so as to prevent arc formation between adjacent conducting layers 134 or from the conducting layers 134 to the surroundings. The electrical connectors are also positioned sufficiently far from the active region 102 to prevent localized breakdown of the electroactive polymer layers 132 during operation. As will be appreciated by those skilled in the art, the commonly stiff electrical connectors can cause localized breakdown in the electroactive polymer layers 132 due to the presence of stress concentrations surrounding the connection between each electrical connector and the conductive layers of the active region 102.

In the general case, the electrical connectors are can be comprised of a wide variety of materials with the common goal of providing a high conductivity pathway to interface the conductive layers 134 with the external power supply. In one embodiment, the electrical connectors are 0.5 thou brass shims soldered to 32 gauge copper wires with high voltage insulation. The brass shims are bonded to the underlying electroactive polymer either by natural adhesion between the polymer and the metal or by the addition of an adhesive such as epoxy.

In most cases, the attachment of the electrical conductors to the conductive layers 134 requires an intermediate stage comprised of a softer material than the electrical connectors. This intermediate stage connector ensures that electrical contact is maintained between the conductive layers 134 and the electrical connectors 104, 106 during high strain operation of the transducer. In one example, a graphite powder conductive layer 134 is bonded to a brass shim electrical connector 104, 106 with the assistance of a bridge of conducting RTV silicone and the conducting RTV silicon acts as an intermediate stage connector. The silicone is pliable enough to maintain electrical conductivity during operation while providing minimal mechanical interference with the transducer during operation.

Mechanical Connectors

Mechanical connectors 108 are a structural element that allow the transducer to safely interface with the surrounding environment. In addition to providing an environmental interface, the mechanical connectors 108 support the active region 102, the positive electrical connector 104, and the negative electrical connector 106. Furthermore, the mechanical connectors 108 provide a means of maintaining uniform deformation throughout the active region 102 during operation.

The mechanical connectors 108 separate the conductive layers 134 and the electrical connectors 104, 106 from the environment. In this sense, the mechanical connectors 108 provide similar isolating characteristics to the insulating/shielding layers 136. In some embodiments, the mechanical connectors 108 are comprised of a stiff insulating material suitable for ensuring isolation between the high voltages within the transducer and the surrounding environment. In other embodiments, the mechanical connectors 108 are comprised of a stiff material that is either conductive, or has a conductive coating on the exterior. The goal in this configuration is to shield surrounding electronics from the high electric fields developed in the transducer during operation.

Figure 1C:
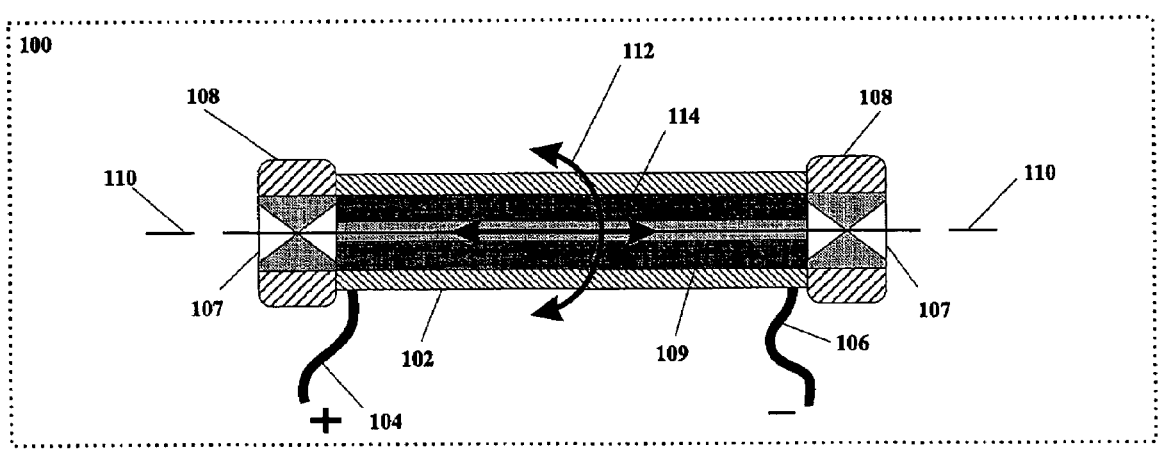
FIG. 1c: is a schematic diagram of a stretched rolled electroactive polymer transducer similar to that shown in FIG. 1a and showing a check valve and a second electroactive polymer.

The mechanical connectors 108 also provide a means of mechanically interfacing the active region 102 with the load. For this task, the mechanical connector 108 is either adhered to the active region 102 by the addition of an adhesive or it is attached to the general purpose layers 138 or the structural supports (described in detail below) as an indirect means of interfacing with the active region 102. To serve the intended function the mechanical connectors 108 are comprised of a material that is much stiffer than the electroactive polymer in the transducer. In one embodiment, the mechanical connectors 108 are hollow and a check valve is placed within the hollow recess of the connector. The check valve 107, an example of which is shown in FIG. 1c, regulates fluid flow through the transducer when it is employed as a peristaltic pump.

Finally, in some embodiments the mechanical connector 108 is designed to establish uniform deformation throughout the electroactive polymer layers 132. The mechanical connector 108 is bonded to the active region 102 in such a way that the deformation in each layer is intrinsically controlled during operation of transducer. One method of achieving this bond is for the mechanical connector to it self be comprised of layers. As the polymer is fabricated, the layers of the mechanical connector are bonded into the structure at different stages of the rolling process so that they are all bonded to the electroactive polymer under different prestretched conditions (which will vary during processing). In this way, one can actually tailor the loads applied to each layer of the structure so that they all deform together during actuation. Another method of achieving this bond is to use a mechanical connector that has differing stiffness through its thickness as can be made by constructing it either by successive emulsion polymerization steps or by making if from a series of rings. As the transducer is constructed, the electroactive polymer layers are bonded locally to the mechanical connector. Later when the device is activated, various layers of the mechanical connector flex differently with the polymer thereby adding improved stress management through the polymer layers during operation. In this way, the deformation is unified throughout the active region 102 and as such, the transducer can operate at higher electric fields without failure.

To improve the ease of assembly of the transducer, the electrical connectors can be integrated into the mechanical connectors 138. In this case, the combined connector may be prefabricated and attached to the roll at a desired stage in the fabrication process. Furthermore, the integration of these two connectors simplifies the resulting device, decreases the size of the device, and improves electrical isolation within the device.

Core-Type Structural Elements

Figure 2A:
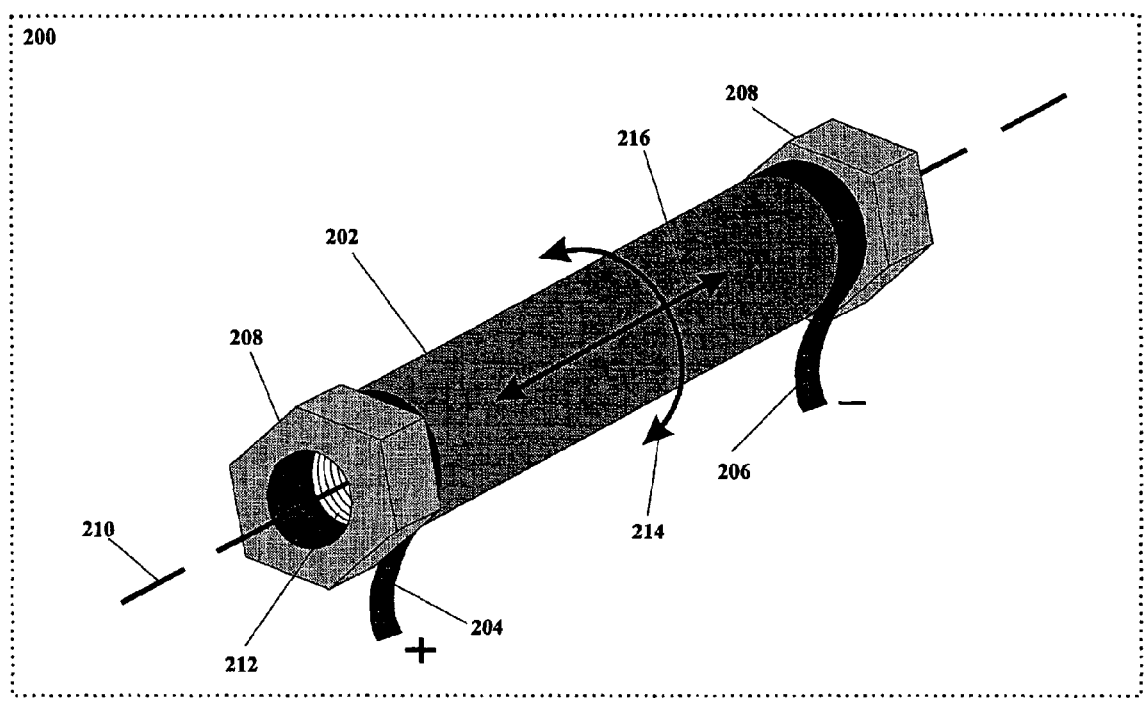
FIG. 2a: is an isometric view of a stretched rolled electroactive polymer transducer with a structural core constructed in accordance with the present invention.

Referring to FIG. 2a a stretched rolled electroactive polymer transducer with a structural core is shown generally at 200. The operational principles of this embodiment are similar in scope to the general case. A voltage is applied between the positive electrical connector 204 and the negative electrical connector 206. This creates an electric field within the active region 202 that mechanically stresses the active region 202 and elicits a response from the transducer along the axis of symmetry 210. The mechanical stresses developed in the electroactive polymer layers are transmitted to the load through the mechanical connectors 208. During operation, the structural core 212 maintains the stretched state in the electroactive polymer layers of the active region 202. The structural core 212 also simplifies the fabrication process for the transducer.

In many embodiments, the structural core 212 is constructed so as to support the active region 202 in the circumferential direction 214 while having minimal stiffness in the axial direction 216. In other embodiments, the axial stiffness of the structural core 212 is optimized to be complimentary to the axial stiffness of the active region 202. In this design, the structural core 212 can be modified to improve the axial strain that can be achieved by the transducer during operation.

Figure 2B:
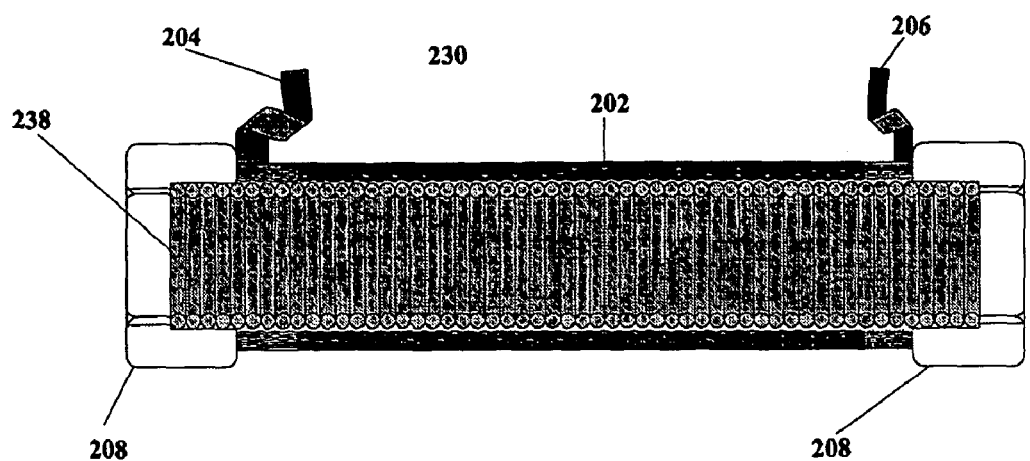
FIG. 2b: is a cross sectional view of a stretched rolled elctroactive polymer transducer having a ring structural core.
Figure 2C:
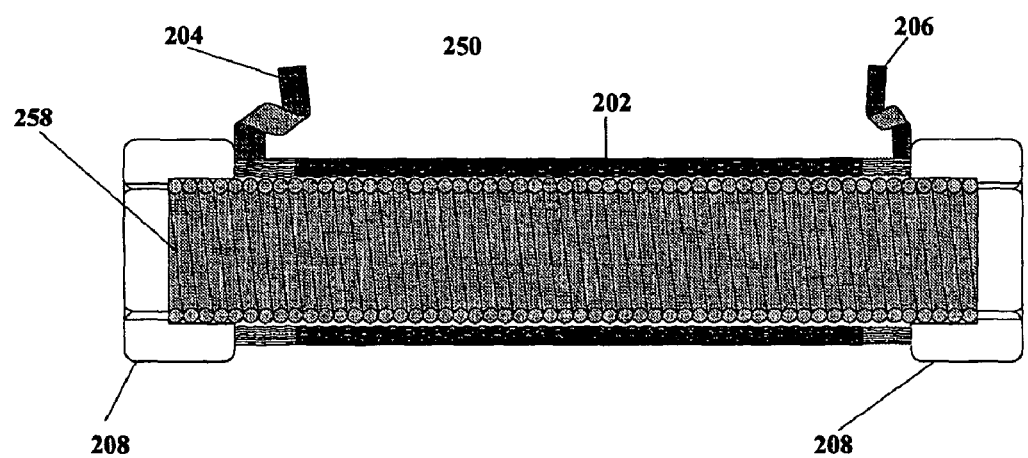
FIG. 2c: is a cross-sectional view of a stretched rolled elctroactive polymer transducer having a spring structural core.
Figure 2D:
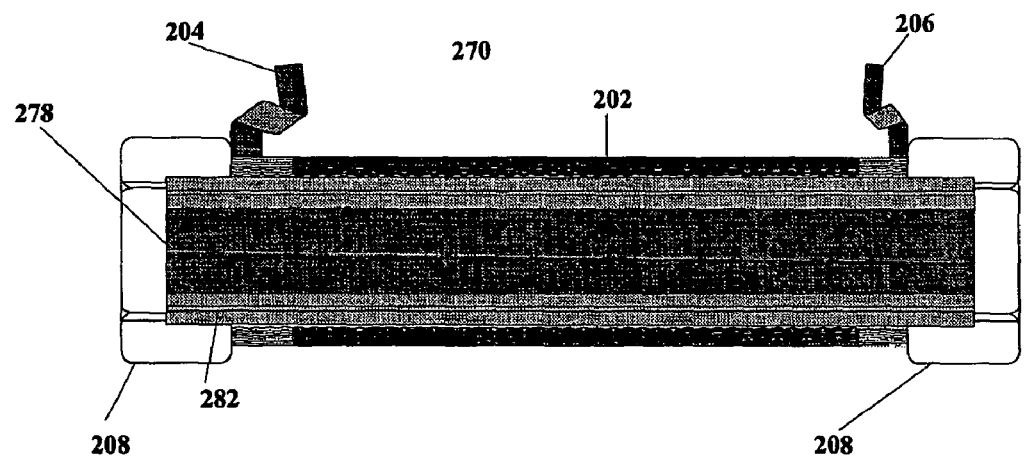
FIG. 2d: is a cross-sectional view of a stretched rolled elctroactive polymer transducer having a tube structural core.

FIGS. 2b–d are cross-sectional view of a range of embodiments for the stretched rolled electroactive polymer transducer with a structural core. The ring core transducer 230, the spring core transducer 250 and the tube core transducer 270, shown in FIGS. 2b, 2c and 2d respectively demonstrate the range of cores and core properties that can be tailored to a specific application.

The ring core transducer 230, shown in FIG. 2b, demonstrates the extreme application of a structural core where the stiffness in the axial direction 216 is minimized while the stiffness in the circumferential direction 214 is maximized. This configuration is accomplished by the alignment of a plurality of stiff discs or rings along the axis of symmetry 210 of the transducer. This arrangement is preferred in applications where the primary advantage to stretching the electroactive polymer is in an increase in the dielectric strength of the polymer versus applications requiring strict control of the axial boundary conditions on the active region 232.

The spring core transducer 250, shown in FIG. 2b, differs in that the stiffness and prestress of the spring core 258 can be easily tailored to optimize the axial stiffness and preload applied to the active region 202 of the transducer. The spring core 258 represents the case where the application requires considerably stiff restraint of the active region 202 in the circumferential direction 214 while the axial restraint on the active region 202 must be considerably lower than in the circumferential direction 214. This degree of control can be used to improve the strain response of the transducer.

The tube core transducer 270, shown in FIG. 2c, differs in that the stiffness in the axial direction 216 is greater than or equal to the stiffness in the circumferential direction 214. The axial stiffness of the tube core 278 can be greatly increased by embedding fibers along the axial direction 216 within the tube core 278. This core type is desired in applications where the axial stiffness of the tube core 278 must be extremely high in comparison to the circumferential stiffness of the tube core 278. One means for increasing the axial stiffness of the tube core 278 is to embed fibers 282 into the walls of the core. In this application, the transducer expands more in the circumferential direction 214 than in the axial direction 216 during activation. This configuration is most ideally suited for transducers that constrict, rather than expand, in the axial direction during activation and for applications as peristaltic fluid pumps.

The structural core 212 may be comprised of several components that play differing roles in the operation or fabrication of the transducer. In particular, the structural core may contain stiff removable elements that assist with the rolling process and are removed after the rolling process is complete. The removable components facilitate the rolling process. In particular the removable components improve the stiffness of the structural core 212 during the rolling process and prevent significant bending of the structural core 212 as the stretched electroactive polymer layers pull on it during the rolling process.

Figure 1D:
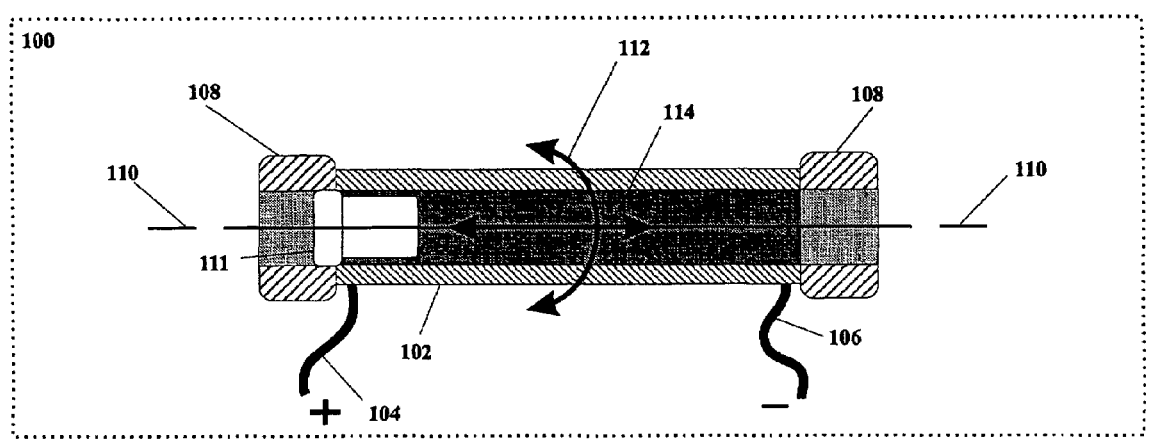
FIG 1d: is a schematic diagram of a stretched rolled electroactive polymer transducer similar to that shown in FIG. 1a and showing sensory electronics housed therein.

In a further embodiment, the structural core 212, used to maintain the stretch in the electroactive polymer, is a multifunctional element. The empty space within the structural core 212 can be used to house electrical components required by the transducer. Capacitors stored in a hollow structural core 212 are used for local energy storage to facilitate quick twitch actuation of the transducer. DC/HVDC conversion electronics and sensory feedback electronics can also be housed within the hollow structural core 212 to reduce the device size, electromagnetic interference and to facilitate operation of the device with a low voltage power supply. An example of electronics housed in the transducer 100 is shown at 111 In FIG. 1d. The structural core 212 may also contain a sensory element that is suitable for obtaining sensory feedback about the state of the transducer for feedback control applications. In one embodiment, the structural core 212 houses a smaller stretched rolled electroactive transducer that is used to measure the strain of the outer transducer. An example of this is shown in FIG. 1c at 109. In this case the structural core 212 both houses the strain sensor, and electronically shields the sensor from the high electric fields in the surrounding transducer. In some applications, the power electronics or voltage amplifier used to drive the transducer can be situated within the cavity of the structural core 212. This integration of the electronics with the electroactive polymer-transducer provides a means of isolating any high voltage signals required to actuate the transducer from the surrounding environment. Thereby the integration of the high voltage electronics into the structural core 212 of the transducer improves the safety and reduces the size of the resulting device.

In a particular example, the sensory precision capacitor and resistor, with values of 10 nF and 10 kohm respectively, used in a capacitive half bridge circuit with the stretched rolled electroactive polymer transducer is situated within the structural core 212 of the transducer. The sensitive electrical node at the center of the capacitive half bridge is shielded from the surrounding transducer by electrifying the metallic walls of the structural core 212. This configuration ensures the integrity of the feedback signal while reducing the space of the device in critical applications.

Figure 2E:
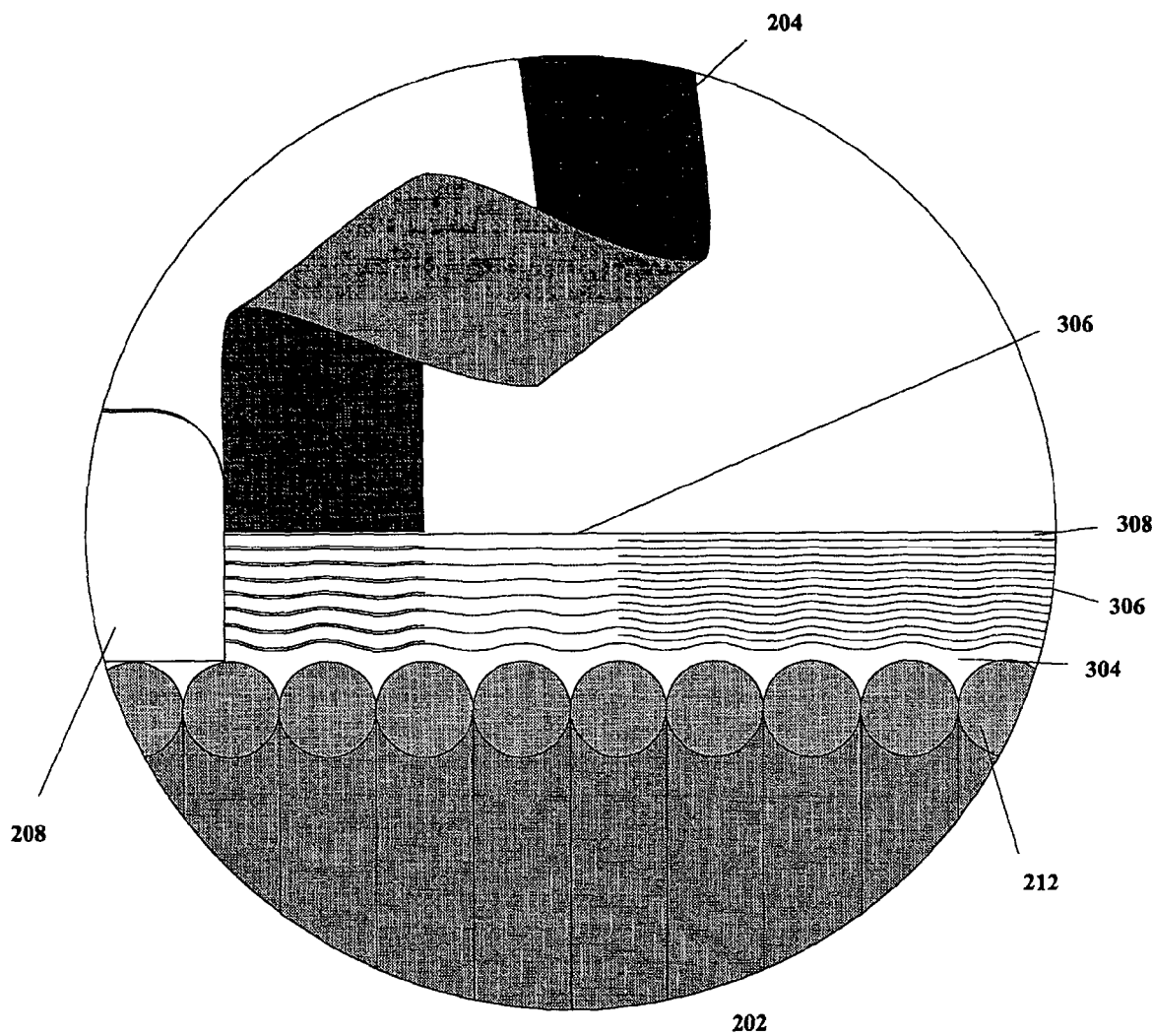
FIG. 2e: is a cross-sectional view of an example of the active region of a stretched rolled electroactive polymer transducer with a structural core.

FIG. 2e is a cross-sectional view of the active region 202 of an embodiment of a stretched rolled electroactive polymer transducer with a structural core 212. The figure demonstrates how the conducting layers 306 are patterned near to the electrical connector 204 or 206 (not shown). Space is provided such that the unavoidable stress concentrations near to the electrical connectors 204, 206 do not lead to premature breakdown of the electroactive polymer layers 308. The figure also illustrates the use of a padding layer 304 to alleviate stress concentration in the electroactive polymer layers 308 and the conducting layers 306 nearest to the structural core 212. A padding layer 304 is necessary in some applications to prevent premature breakdown in the electroactive polymer layers 308. The properties of the padding layer 304 must be considered in order to both alleviate stress concentrations in the electroactive polymer layers 308 and insignificantly affect the axial stiffness of the transducer. The padding layer 304 is also responsible for minimizing the number of rippled electroactive polymer layers 308 visible in the figure, as these layers do not contribute fully to the transduction of the device.

Non-Core-Type Structural Elements

Figure 3A:
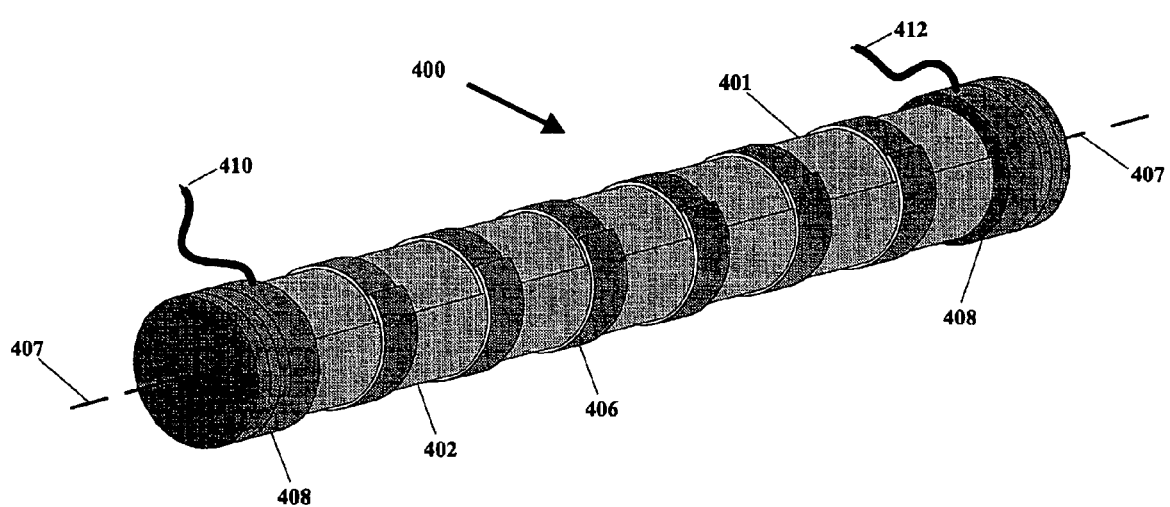
FIG. 3a: is an isometric view of a stretched rolled electroactive polymer transducer without a structural core.

FIG. 3a is an isometric view of a stretched rolled electroactive polymer transducer without a structural core 400. In this embodiment, the active region 402 is composed of a plurality of active region sections 401 interspaced along the length of the transducer. Each active region section 401 is connected to the adjacent active regions by an electrical connector which are underneath structural supports 406. Thereby, all active regions are connected to an external power supply through the electrical connectors 404. The active regions are separated by the structural supports 406. The structural supports 406 are bonded to the polymeric material that makes up the active region 402. The structural supports 406 prevent the adjacent polymer layers from sliding past each other and also prevent the relaxation of the active regions in the vicinity of the structural supports 406. The ends of the device are encapsulated in a polymeric mechanical connector 408. The mechanical connector enforces uniform deformation conditions on the active region 402 and further acts as a means to connect the transducer 400-to the surrounding environment. The mechanical connector 408 also isolates the high voltage positive electrical connector 410 and the negative electrical connector 412 within the active regions 402 from the surrounding environment.

This embodiment is different from the stretched rolled electroactive polymer transducer with a structural core 200 in that the structural supports 406 are rolled along with the active region 402, bonded to each layer of the active region 402, and longitudinally spaced along the axis of symmetry 407 of the transducer. The structural supports 406 are responsible for maintaining the prestretch applied to the electroactive polymer layers during and after the fabrication process.

The active region 402 is constructed such that the conductive layers are patterned onto the electroactive polymer layers in the regions surrounding the structural supports 406. Conducting links are patterned across the structural supports 406 to ensure that the conductivity between sections 401 of the active region 402 is maintained during operation. The conductive layers are not fully patterned under the structural supports 406 so as to minimize the likelihood of activation of the electroactive polymer layers under the supports and to minimimize the likelihood of the stress concentrations in these regions cannot promote premature dielectric breakdown of the transducer during operation. As with other embodiments, it is advantageous for adjacent electroactive polymer layers to be bonded to each other to prevent relative motion between layers during operation. In one embodiment, latex rubber layers are bonded together using a solvent-based contact cement as received from Lepage.

In these embodiments, the structural supports 406 are comprised of thin stiff strips that are bonded directly to the active region 402 prior to the rolling process. Preferably the structural supports 406 are positioned regularly along the axis of symmetry 406 to ensure that the active region 402 is subjected to uniform deformation during operation. Furthermore, preferably the structural supports 406 are positioned closely enough to one another such that the prestretch applied to the active region 402 is maintained uniformly along the axis of symmetry 406. This can also be seen in FIGS. 4b, 4c and 4d.

This embodiment is more suited for use with, but not exclusive for use with, electroactive polymers that do not exhibit significant creep-like behavior. This includes, but is not limited to, cross-linked dielectric elastomeric materials such as latex rubbers, ethylene/propyiene/dienes (EPDM), Styrene Butadiene rubbers (SBR rubbers), and polydimethylsiloxanes (PDMS). In one embodiment, 2 mm wide structural supports 406 constructed from a silicone adhesive, lot: 67113-2-2 as available from BISCO, are spaced 7.5 mm apart along a stretched latex rubber roll with an outer diameter of 5 mm.

Fabrication

Figure 4A:
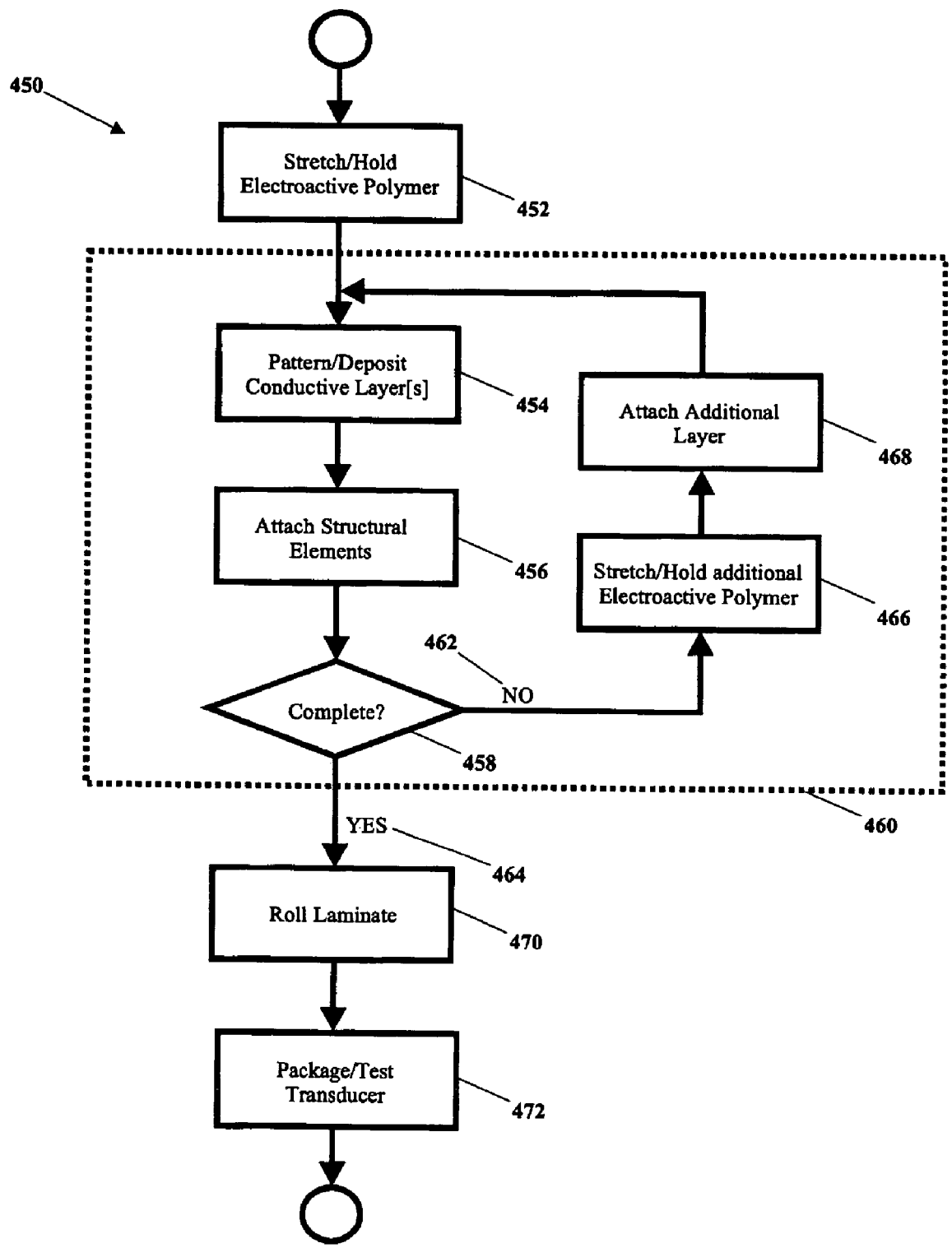
FIG. 4a: is a flow chart depicting the general fabrication stages of a stretched rolled electroactive polymer transducer.

FIG. 4a outlines the general fabrication process 450 for the development of stretched rolled electroactive polymer based transducers. The first step in the fabrication process 450 is to stretch and hold the base electroactive polymer layer 452. Once the desired stretch has been applied to the layer, conductive layers are patterned and deposited on top of the stretched electroactive polymer 454. After deposition of the conducting layers, structural elements as outlined previously may be attached at this stage 456 or in a later iteration through the principle loop of the fabrication procedure. After completion of the base layers, a decision is made as to whether or not the device is complete 458, if so then additional layers are added to the existing structure 462, otherwise the rolling process is begun 464.

In the case that additional layers are to be added to the existing structure 462, another layer of electroactive polymer is stretched and held in preparation to be added to the existing structure 466. This stage may also include the folding of an existing laminate in preparation for the rolling-process 470 if this is the last iteration through the principal loop 460. The stretched electroactive polymer layer is then attached to the existing laminate 468 by means of an additional adhesive or by virtue of the adhesive qualities of the electroactive polymer itself. Another conductive layer is patterned and deposited onto the existing laminate 454 and additional structural elements may be attached to the laminate at this stage in the fabrication process 456.

In the case that the laminate is deemed complete 464 the rolling stage is initiated 470. In this stage 470, the rolling of the laminate is completed and adhesive is added as necessary to bond adjacent layers of the laminate. At the completion of the rolling stage 470, the resulting transducer is packaged and tested 472. Packaging involves the attachment of extra electrical and mechanical connectors to the transducer that were not added during the principal loop 460 and the deposition of isolation/shielding layers to the active region of the transducer.

To improve the electrical and mechanical properties of the electroactive polymer, the material is stretched and held 452 during the fabrication process 450. If stretching and holding 452 are performed after the polymerization of the electroactive polymer, then several techniques may be used based on the mechanical straining of the polymer layers. In one example, the electroactive polymer layer is stretched using a series of clamps and held by bonding the stretched layer to a stiff frame using epoxy. In the case that the effect of stretching is done during the polymerization reaction, the appropriate orientation can be achieved by stretching the polymer, exposing the reactants to a strong electrical field, or exposing the reactants to a strong magnetic field during polymerization. In this case, the orientation may be maintained without the need to hold the polymer with extra frames as in the case of post-polymerization stretching.

The stretched polymer may be held during fabrication by many techniques including frames, structural elements, structured electrodes and many more. In one embodiment, the electroactive polymer is stretched and cooled at or below the glass transition temperature. Below this temperature, the electroactive polymer can be released from the stretching apparatus and will maintain its stretched state. In this case, further processing of the transducer is greatly simplified in that extra structural elements are not required during the rolling stage 470 of the fabrication procedure. Care must be taken with the frozen electroactive polymer so as not to crack it during the rolling stage 470 of the fabrication procedure.

After the base electroactive polymer layer is stretched and held 452, the initial conductive layers are patterned and deposited 454 onto the electroactive polymer layer. On the first cycle through the principal loop 460, typically two conductive layers are patterned onto the electroactive polymer. In additional cycles through the principal loop 460, it is more common for only one additional conductive layer to be patterned and deposited onto the existing laminate.

Patterning and deposition of the conductive layers 454 can be achieved using a wide variety of well-known techniques in the printed circuit board and microfabrication industries. In one embodiment, the electroactive polymer layer is masked using a silicone stencil. A conductive powder is sprayed onto the electroactive polymer layer in the exposed areas on the polymer surface after which the stencil is lifted away from the laminate. During the patterning and depositing stage 454 extra electrical connections may also be added to facilitate multiple separate electrodes and/or the connection of conductive layers in a multi-layered laminate design.

After the most recent conductive layer or layers have been patterned and deposited 454 onto the laminate, additional structural elements may be attached 456 to the laminate. In the case of a transducer with a structural core, it is common for the structural core to be attached through the last iteration of the principal loop 460. In the case that the transducer does not have a structural core, it is common for the structural elements to be attached to the laminate on several iterations of the principal loop 460. The frequency with which the structural elements are attached 456 is a function of the particular application in question. In one example, the structural elements are attached to the laminate during every fifth cycle through the principal loop 460. During attachment 456 of the structural elements it is also common to layer the laminate with a thin soft adhesive layer between the structural elements. This step helps alleviate stress concentrations and maintains a uniform laminate thickness for the attachment of the next layer.

At this point in the fabrication process 450 a decision 458 is made regarding the state of completion of the laminate. The decision stage 458 may include a testing procedure to reject damaged laminates to save time during processing. If the layering process is complete 464, then the rolling stage 470 is initiated. Otherwise 462, an additional layer is added to the laminate. In the latter case, an additional electroactive polymer layer is stretched and held 466 in preparation for attachment 468 to the laminate.

The additional electroactive polymer layer is stretched and held 466 in much the same manner as the base layer. The primary variation in this approach is that the apparatus used to hold the additional layer must facilitate intimate contact between the additional layer and the laminate to ensure adhesion is possible. In another embodiment, the stretching and holding 466 of the additional layer may encompass folding the laminate in order to enclose one or more conductive layers prior to the rolling stage 470. In this manner a rolled transducer may be fabricated from a single electroactive polymer layer that has been strategically patterned with conductive layers.

The additional electroactive polymer layer is attached 468 to the existing laminate either by the addition of an adhesive or by virtue of the adhesive properties of the electroactive polymer layers. After the additional layer is added to the laminate, the principal loop 460 is reiterated.

After the laminate is complete, it is ready for the rolling 470 stage of the fabrication process 450. If the transducer is of the structural core type, a structural core is added to the laminate during the structural element attachment stage 456 and this core can be used to assist with the rolling process 470. Alternatively, the laminate is rolled about a mandrel or in the case the polymer is frozen or the orientation is maintained at the equilibrium state of the polymer, the rolling can proceed normally even though the electroactive polymer layers prestretched. During the rolling process 470, adhesive may be introduced to bond adjacent layers in the roll and to terminate the rolling process 470. The adhesive selected must not interfere significantly with the stiffness properties of the resulting transducer. It is also possible to freeze the entire laminate by dropping its temperature below the lowest glass transition temperature of its components. Then the prestretch will be "frozen" into the laminate. In this case the forces associated with the prestretch will be held internally by the laminate, instead of having to be held by a mandrel as in cases without freezing. Then the transducer can just be rolled up like a sheet of paper, and as it is reheated to room temperature, the stresses in the laminate will relax as the polymer layers soften and the laminate roll will constrict tightly around the structural core. So by lowering the temperature below the glass transition temperature for the laminate, the job of rolling it into a completed transducer can be more easily facilitated.

Finally after the rolling stage 470 of the transducer is complete, it is packaged and tested 472. Packaging involves the attachment of extra electrical and mechanical connectors to the transducer that were not added during the principal loop 460 or rolling process 470 and the deposition of isolation/shielding layers to the active region of the transducer. The resulting transducer is then tested 472 for proper isolation, shielding, and operation.

Figure 4B:
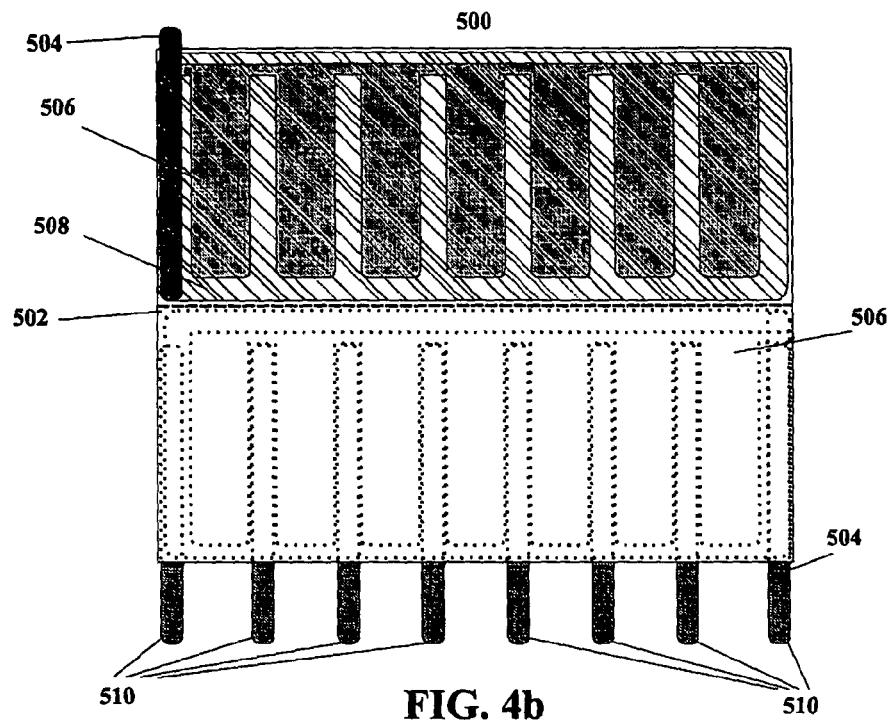
FIG. 4b: is a schematic diagram of the frozen laminate depicted after the principal loop of the fabrication of a stretched rolled electroactive polymer transducer without a structural core.
Figure 4C:
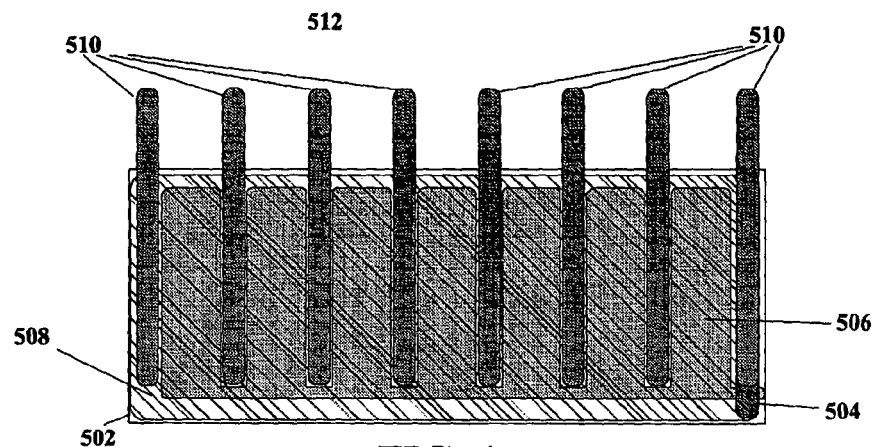
FIG. 4c: is a schematic diagram of the folded frozen laminate depicted prior to the rolling stage in the fabrication of a stretched rolled electroactive polymer transducer without a structural core.
Figure 4D:
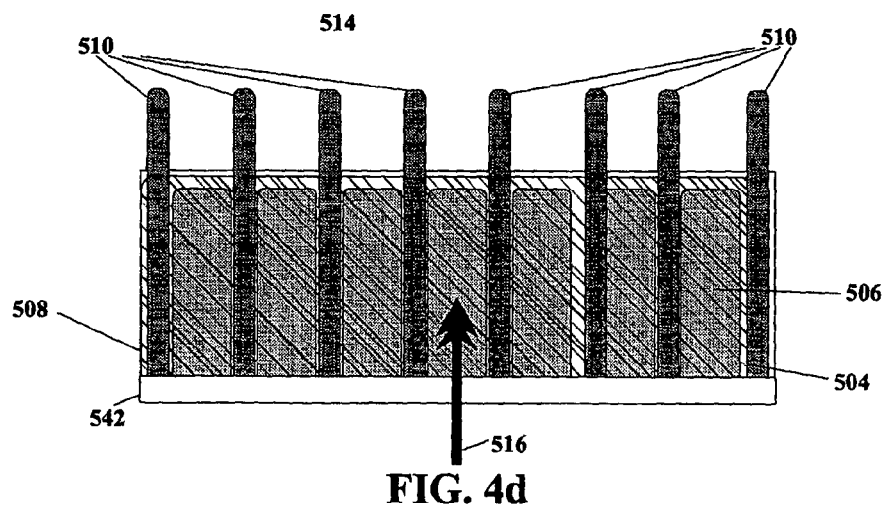
FIG. 4d: is a schematic diagram of the partially rolled frozen laminate depicted during the rolling stage in the fabrication of a stretched rolled electroactive polymer transducer without a structural core.

FIGS. 4*b–d* depict key fabrication stages in the development of a core-less stretched rolled electroactive polymer transducer 400. The fabrication stages are shown for the case of a frozen electroactive polymer as indicated above.

FIG. 4b shows the frozen laminate 500 after the completion of the principal loop 460. The electroactive polymer layer 502 has been coated by the strategically patterned conductive layers 506 and the electrical connectors 504. The structural elements 510 have been attached to the frozen laminate 500 and a thin adhesive layer 508 has been added to the laminate to facilitate further processing. In this example, the electrical connectors 504 have been integrated into the structural elements 510 to improve the structural integrity of the design.

FIG. 4c shows the folded frozen laminate 512 resulting from the folding of the frozen laminate 500 to enclose one of the conducting layers 506. Also shown is an extra adhesive layer 508 that facilitates the rolling process 470. In some cases it is beneficial to test the transducer as a folded frozen laminate 512 to detect flaws in isolation between layers so that extra adhesive can be added prior to the rolling process 470.

FIG. 4d shows a partially rolled frozen laminate 514 during the rolling process 470. The frozen folded laminate 512 is rolled along the rolling direction 516. Extra adhesive is added if necessary in order to maintain proper adhesion of adjacent layers during the rolling process 470.

After the rolling process 470 is complete, the mechanical connectors 408 and the positive electrical connector 410 and the negative electrical connector 412 are attached to the rolled transducer. The completed core-less stretched rolled electroactive polymer transducer 400 is then packaged and tested 470.

The current invention significantly improves the performance of the dielectric elastomer transducer by attaining high transverse prestretch in a lightweight, compact package. The stiff support materials are sufficient to keep the polymer stretched in the circumferential direction while also providing a means of interfacing the device with its environment and minimizing interference with the axial movement of the transducer. Furthermore, the mechanical properties of the support materials can be optimized to further enhance performance of the device by increasing the maximum strain output of the device, increasing the stiffness of the device or introducing biaxial stretch to the electroactive polymer layers.

As used herein, the terms "comprises" and "comprising" are to be construed as being inclusive and opened rather than exclusive. Specifically, when used in this specification including the claims, the terms "comprises" and "comprising" and variations thereof mean that the specified features, steps or components are included. The terms are not to be interpreted to exclude the presence of other features, steps or components.

It will be appreciated that the above description related to the invention by way of example only. Many variations on the invention will be obvious to those skilled in the art and such obvious variations are within the scope of the invention as described herein whether or not expressly described. Further, other embodiments and modifications of the present invention may be possible in light of the foregoing exposition. Therefore, it is to be understood that the present invention is not to be limited to the exposition presented and that such further embodiments and modifications are intended to be included in the scope of the appended claims.

What is claimed as the invention is:

1. An actuator comprising:
an active region having at least one electroactive polymer layer, each polymer layer having anisotropic mechanical properties responsive to an electrical change, at least two conducting layers arranged wherein a conducting layer is on each side of each polymer layer, and a general purpose layer wherein the general purpose layer includes at least one of oriented insulating fibers in a circumferential direction suspended in a soft matrix and a flexible printed circuit board;
a pair of mechanical connectors at either end of the active region;
a positive connector operably connected to the active region; and
a negative connector operably connected to the active region.

2. An actuator as claimed in claim 1 further including a means for monitoring strain feedback for the active region whereby the actuator acts as a transducer.

3. An actuator as claimed in claim 2 where the electroactive polymer layer is prestretched during fabrication.

4. An actuator as claimed in claim 3 wherein the electroactive polymer layer is one of a single polymer, a copolymer and a composite.

5. An actuator as claimed in claim 3 wherein the electroactive polymer layer has a circumferential direction and an original length and the prestretch of the polymer layer in the circumferential direction is between 50% and 600% of its original length in the circumferential direction.

6. An actuator as claimed in claim 5 wherein the electroactive polymer layer has an axial direction and an original length and the prestretch of the polymer layer in the axial direction is between 0% and 150% of its original length in the axial direction.

7. An actuator as claimed in claim 3 wherein the thickness of the electroactive polymer layer is between 0.1 um–1 mm.

8. An actuator as claimed in claim 3 wherein the electroactive polymer layer includes a plurality of adjacent thin layers.

9. An actuator as claimed in claim 8 wherein electroactive polymer includes a thin layer of one of a conducting particulate and a conducting flake and the next adjacent layer is one of a low hardness RTV silicone and low hardness elastomer.

10. An actuator as claimed in claim 2 further including a means for obtaining electrical energy from the transducer responsive to a mechanical load and an electrical load applied thereto whereby the transducer acts as an electrical generator.

11. An actuator as claimed in claim 3 wherein each conducting layer is conducting material chosen from the group consisting of gel, powder, grease, polymer, composite and patterned metal and a combination thereof.

12. An actuator as claimed in claim 3 wherein each conducting layer includes a plurality of layers.

13. An actuator as claimed in claim 12 wherein at least one conducting layer includes a cross-linked elastomeric layer.

14. An actuator as claimed in claim 12 wherein at least one conducting layer includes a patterned layer.

15. An actuator as claimed in claim 12 wherein at least one conducting layer includes at least one distinct patterned region.

16. An actuator as claimed in claim 12 wherein at least one conducting layer includes a plurality of distinct patterned regions.

17. An actuator as claimed in claim 12 wherein the thickness of each of the plurality of conducting layer ranges from 0.05 um to 100 nm.

18. An actuator as claimed in claim 3 further including a shielding layer.

19. An actuator as claimed in claim 18 wherein the shielding layer is one of low insulating low durometer elastomer, polydimethylsiloxane microcellular foam, and conducting RTV silicone.

20. An actuator as claimed in claim 18 wherein the shielding layer is polydimethylsiloxane microcellular form having a thickness from 0.1 mm to 1 mm.

21. An actuator as claimed in claim 1 wherein the active region is arranged such that there is a first conducting layer, the first electroactive polymer layer, a second conducting layer, a general purpose layer, a third conducting layer, a second electroactive polymer layer and a fourth conducting layer.

22. An actuator as claimed in claim 21 wherein the general purpose layer further includes one of an anisotropy composite material, and a thin stiff polymer.

23. An actuator as claimed in claim 21 wherein the general purpose layer has monitorable electrical properties.

24. An actuator as claimed in claim 21 wherein the general purpose layer further includes one of a thin stiff polymer composed of one of a polypropylene and mica, and a ceramic.

25. An actuator as claimed in claim 21 wherein the general purpose layer further includes a thin dielectric media capable of energy storage.

26. An actuator as claimed in claim 18 wherein the mechanical connectors are made of a stiff material.

27. An actuator as claimed in claim 26 wherein the stiff material is an insulating material.

28. An actuator as claimed in claim 26 wherein the stiff material is one of a conductive material and an insulating material which has a conductive coating.

29. An actuator as claimed in claim 3 wherein the transducer is hollow.

30. An actuator as claimed in claim 29 wherein a check valve is positioned in the hollow of the actuator.

31. An actuator as claimed in claim 3 wherein one of the pair of mechanical connectors is integrally attached to the positive connector and the other of the pair of mechanical connectors is integrally attached to the negative connector.

32. An actuator as claimed in claim 18 further including a structural core.

33. An actuator as claimed in claim 32 wherein the structural core includes one of a spring, a tube, a plurality of rings and a plurality of discs.

* * * * *